United States Patent [19]

Moll et al.

[11] Patent Number: 5,037,262
[45] Date of Patent: Aug. 6, 1991

[54] HOLDING DEVICE FOR A DISK AND APPLICATION THEREFOR

[75] Inventors: Eberhard Moll, Schellenberg; Renzo Zanardo, Balzers, both of Liechtenstein

[73] Assignee: Balzers Aktiengesellschaft, Balzers, Liechtenstein

[21] Appl. No.: 378,641

[22] Filed: Jul. 12, 1989

[30] Foreign Application Priority Data

Jul. 15, 1988 [CH] Switzerland ............... 2722/88

[51] Int. Cl.⁵ .................................... C23C 14/00
[52] U.S. Cl. .................................... 414/222; 269/20; 269/903; 118/503; 118/732; 118/730; 204/298.15; 156/345; 414/217; 414/757; 414/781
[58] Field of Search .............. 414/222, 225, 217, 221, 414/589, 590, 757, 781; 204/298.15; 156/345; 269/20, 21, 903; 118/503, 729, 730, 732

[56] References Cited

U.S. PATENT DOCUMENTS

| 4,189,230 | 2/1980 | Zasio | 269/903 X |
| 4,344,383 | 8/1982 | Salt, Jr. | 118/730 |
| 4,422,897 | 12/1983 | Horwitz | 156/345 X |
| 4,441,853 | 4/1984 | Kosugi | 414/757 |
| 4,473,455 | 9/1984 | Dean et al. | 118/503 X |
| 4,542,298 | 9/1985 | Holden | 118/503 X |
| 4,544,311 | 10/1985 | Husain | 269/21 X |
| 4,655,584 | 4/1987 | Tanaka et al. | 414/225 X |
| 4,674,621 | 6/1987 | Takahashi | 414/225 X |
| 4,764,076 | 8/1988 | Layman et al. | 414/225 X |
| 4,990,047 | 2/1991 | Wagner et al. | 414/226 X |

FOREIGN PATENT DOCUMENTS

| 56-04244 | 1/1981 | Japan | 414/222 |
| 56-80135 | 7/1981 | Japan | 156/345 |
| 59-46031 | 3/1984 | Japan | 156/345 |
| 0136314 | 7/1985 | Japan | 118/730 |
| 0189927 | 9/1985 | Japan | 118/730 |
| 1140432 | 6/1986 | Japan . | |
| 3131520 | 6/1988 | Japan . | |
| 3219137 | 9/1988 | Japan | 156/345 |
| 3291423 | 11/1988 | Japan | 156/345 |

Primary Examiner—David A. Bucci
Assistant Examiner—William M. Heinz
Attorney, Agent, or Firm—Notaro & Michalos

[57] ABSTRACT

A holding device for semiconductor disks or wafers orients and secures the disk during transport to a working position. Shortly before the disk reaches a working position the device releases the surface to be worked or secures the disk position with the aid of a ring which remains in the working position. Thereby the disk surface can be worked completely or with minimal shadowing and simultaneously the transport mechanics can be effectively protected against the working process, for example coating or etching. All parts continuously exposed to the working process can be readily exchanged. If the disk remains adhered in the working station, it is torn off by a form-fitting transport securement.

31 Claims, 5 Drawing Sheets

HOLDING DEVICE FOR A DISK AND APPLICATION THEREFOR

FIELD AND BACKGROUND OF THE INVENTION

The present invention relates to a holding device for a disk during its transport on a base having a support surface for the disk from one loading position for the disk, toward a working position for the disk. The invention also relates to an application of the holding device for circular disks for semiconductor fabrication or for the fabrication of storage disks.

The working of disks, for example of silicon disks for semiconductor fabrication or of disks for the fabrication of data storage disks, takes place more and more in so-called inline installations wherein only one disk is worked in the different process stations at one time. Each individual disk is therein transported from process station to process station and there deposited on a base. Normally the transport takes place with the disks lying horizontally. For the working of a disk in a different, for example vertical, position, the base with the disk held thereon is most often swivelled accordingly in the process station.

SUMMARY OF THE INVENTION

The present invention relates not to the transport of a disk from process station to process station but rather to transporting motions within a process station, possibly including a swivel motion if needed. It is assumed that the disk to be treated has been deposited by means of one of the known transporting devices on a base in a loading position, and that after it has been worked it will be exchanged for a disk which has not yet been worked.

Thus the holding device according to the invention functions to bring the disk from the loading position into the working position and back. The working position can herein also lie in a separate chamber. In this case transport must take place from the loading position in the one chamber into the working position in another chamber and back. In the case of a vacuum installation, process gas exchange between different process stations can be reduced through such a chamber separation. A vacuum-tight separation of the chambers is achieved if the disk is brought into the working chamber with the same motion that is used to close the opening to the working chamber. This is done, for example through the use of a valve plate developed simultaneously as carrier for the disk to be treated.

In most installations the disks are held somehow on their base during the transport, for example through gripper-like leaf springs which rest on the edge. These holding members can be brought into an open or closed position for the purpose of exchanging the disk. The problem therein is that the holding members in the working position of the disk carrier are repeatedly exposed to the effect of the working and must finally be exchanged. This exchange can only take place during an interruption in the fabrication process.

If this working is a coating process, for example coating with 1 μm of aluminum per disk at a throughput of one disk per minute, then in five days an aluminum layer of more than 7 mm can form. Protruding aluminum knobs then lead often to undesirable shading-off in coating the disk. The disk may even grow together with the holding members and subsequently remains adhered to them. If the working is an etching process, the holding members are also etched and the material removed from them can contaminate the disk surface in the process. In purification etching of the disk through cathode sputtering the holding members also cause potential distortions and, consequently, often a type of corona or shadow.

Installations also exist in which a disk to be treated is placed in a horizontal position on a lifting table and subsequently transported into the working station without special holding equipment. Therein the above described problems are indeed avoided, but during transport there is no security that the disk will remain in a defined position which is necessary for a rapid and yet reliable transport.

The present invention is based on the task of constructing a universally applicable holding device which secures the disk during transport and yet avoids the problems of the known holding members.

Accordingly, an object of the present invention is to provide a holding device for holding a disk during transport thereof, comprising a base with a support surface for receiving the disk at a loading position and for movement of the disk to a working position, at least three positioning or holding members mounted for movement toward and away from each other for engaging peripheral regions of the disk and a covering for covering the holding members when they are driven into a position spaced away from each other.

A direction of transport parallel to the disk surface is indeed meaningful with a transport of the disk from process station to process station in a vertical position, although only if the disk is pressed in an intermediate position against a movable holder which secures the disk during the following transport from the intermediate position to the working position and during the working operation. With nearly vertical disk position this condition can be omitted.

It happens that disks are not to be worked at the edge for example in the case of storage disks. With semiconductor disks, in contrast, it is desirable to achieve maximum possible uniformity of working up to the edge. The disk should then be immersed into the working station completely, i.e. it should project from the cover. In this case, in order to prevent the requirement that the holding members must be moved into a position where they no longer interfere, i.e. extremely far away, holding members according to the invention are preferred which can be resiliently shortened in the direction of transport. As soon as they come in contact with the cover they are compressed and thereby protected especially well at their ends against the effects of the working operation.

Visual contact between the working station and the holding members can also originate through the gap between the disk on the base, on the one hand, and the cover on the other. A customary method used for closing this gap is an annular screen, fastened on the base and transported with it, which from time to time must be replaced. The cover according to the ivention, in contrast, is preferably a frame which, for example shortly before reaching an intermediate position, lies down on an edge provided for that purpose on the base or onto a screen transported along with it, but is not itself taken along into the loading position but rather remains in the vicinity of the working position. The frame preferably is provided as a loose freely exchangeable part.

It is a particular advantage of the holding device according to the invention that the disk, depending on the type of working, can be worked lying free or secured with the aid of the stated frame. Therein the frame lying on the base can be exchanged for one that rests on the disk itself. Thus, it is possible to use the same holding device in the same installation for various process stations or in the same process station to exchange the working module, for example a planar magnetron for another module, for example an etching device, and thereby to work in one case a disk lying free, and in the other a secured disk by exchanging the frame.

Securing the disk with the frame can take place in such a manner that only a few hooks are in contact with the disk. In this case also a large part of the disk edge is worked. But it can also be of interest to touch the entire edge, for example in order to achieve a sealing effect for a gas cushion between the disk and the base. The frame can in this case be fastened in a gas-tight manner by means of a bellows seal at the installation housing. Such a gas cushion would be used as thermal conducting means between the disk and a heating or cooling plate. The pressure of the gas cushion generates therein a force which, for example can be surmounted by a larger weight of the frame as counter force, and which presses the disk gently against the frame. The spring effect of a bellows or specially provided springs for this purpose can be used to that end.

It is most often useful to protect not only the holding members but also the base from the working process. This takes place most simply if the base is covered fully by the disk. In the case of semiconductor disks for the manufacture of integrated microelectronic modules the base then must also have contours deviating from the circular shape, for example the segments cut off for the identification of the crystal orientation. The latter are also the reason for the necessity to hold the disks oriented. In a preferred embodiment of the holding device the holding members are so arranged that at least two holding members, rotatable parallel to a normal to the disk, press onto the segment and therewith correct deviations from the precise orientation from station to station. The holding members holding against it or parts of the loading device are likewise rotatable about an axis parallel to the disk normal.

If the installation is to be converted to working other disks, the changes at the holding members can be kept small if the motion between the "open" and "closed" positions are swivelling motions about an axis parallel to the disk normal.

An important advantage of the holding device according to the invention can be found in that an adhesion of the holding members with the disk is avoided. In the event adhesion with the frame takes place, the holding members can incidentally fulfil the important role of a tearing-off device. During the transport back they close around the disk in the intermediate position and thus ensure the secure transport back to the loading position.

If, as was stated above, a frame functioning as holding frame is provided, then therewith a holding device inventive per se is created for a disk in working position. If now, as was stated, a transport arrangement for the base with the disk is provided then through its transport the disk is placed against the frame and in one embodiment variation is lifted with the disk so that the frame braces itself on the disk with its weight and in this way holds it.

If on the other hand on the base a gas feeding line for the generation of a gas cushion between the base and the disk is provided, then the frame can remain stationary and the spring effect of the gas cushion is utilized in order to place the disk gently and with possibly settable force against the frame.

In any case forces develop thereby between disk and frame which are parallel to the surface normal of the disk. By providing positioning and/or orienting devices on the frame these forces are exploited, in order for example through guide areas to bring the disk as far as this is necessary into the precise working position or even bring it from a previously used working position for a succeeding working with the last applied frame analogously into a new working position. With the aid of the gas cushion, if necessary settable with respect to its pressure, it is possible to load the sensitve disk only extremely gently and yet to bring it nevertheless into a defined position or to keep it there.

The various features of novelty which characterize the invention are pointed out with particularity in the claims annexed to and forming a part of this disclosure. For a better understanding of the invention, its operating advantages and specific objects attained by its uses, reference is made to the accompanying drawings and descritive matter in which preferred embodiments of the invention are illustrated.

DESCRIPTION OF THE PREFERRED EMBODIMENTS

Figure 1:
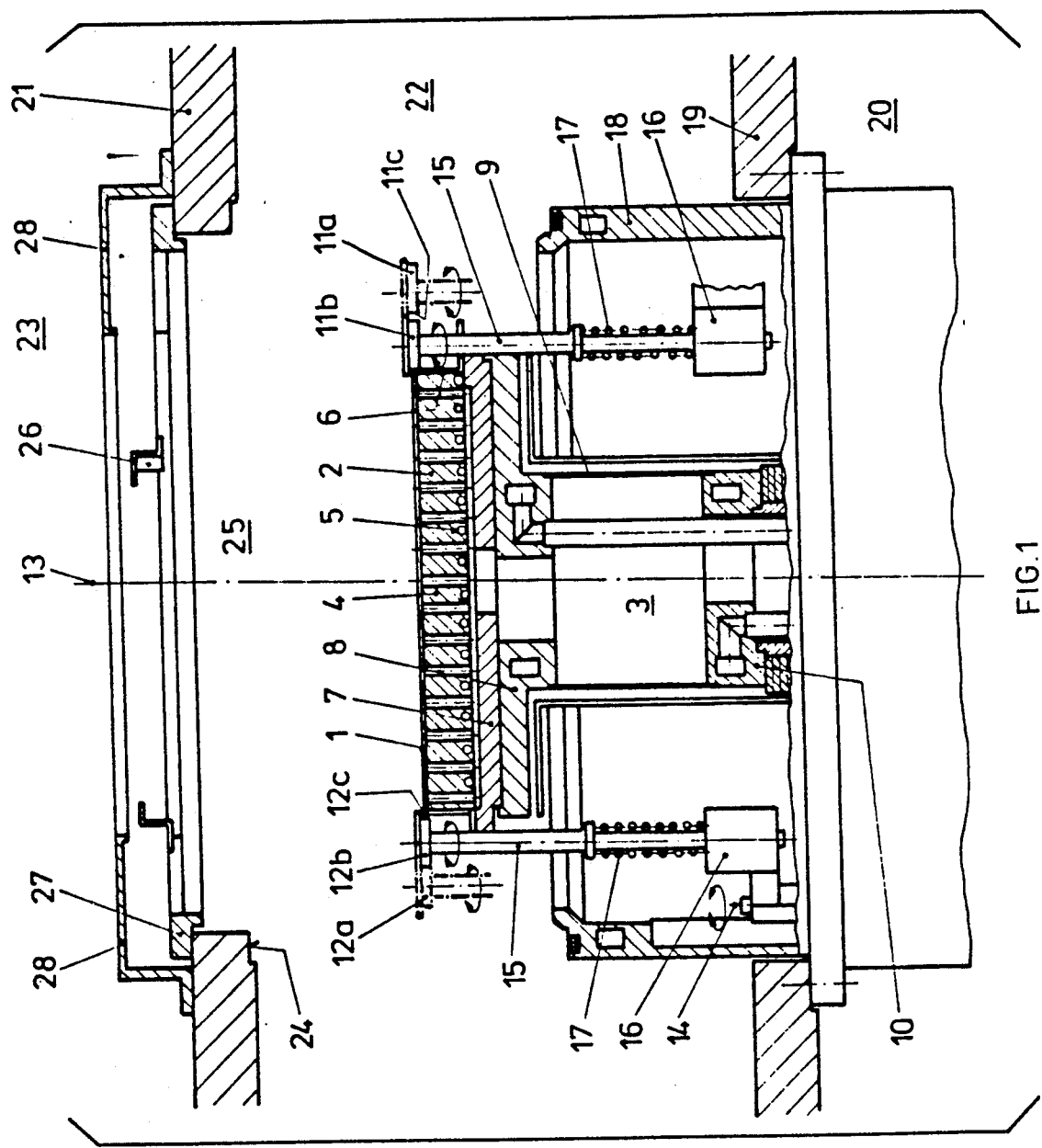
FIG. 1 is a sectional view of a holding device according to the invention in the loading position.

FIG. 1 depicts the condition after the deposition of a disk 1 on a base 2 in a loading position. The base 2 in this case is eqipped with a heating plate 4. Plate 4 has bores through which a gas can reach between the disk 1 and the heating plate 4. A heating element 5 can heat the heating plate 4 to temperatures up to more than 500° C. This temperature is transferred through the gas as thermal conducting means to disk 1. Most often the same gas is used as in the process since a sealing along the base edge 6 is only more or less possible. A flange 7 is positioned under the heating element 5 and defines a space with plate 4 to which gas is supplied for to the bores of the heating plate 4. Plate 4 and the flange 7 are fastened together on a feed-through module comprising a flange 8 with rapid cooling arrangement, which in turn is connected in a gas-tight manner through a thin thermally insulating pipe 9 to a cooled structural part 10 which is electrically insulated from flange 8. A gas chamber defined between plate 4 and flange 7 distributes gas to the bores in the plate 4.

After the disk 1 is deposited on the base 2, opposite holding or positioning member 11 and 12 move from an "open" or release position 11a and 12a (shown in dashed line) to a "closed" or engagement position 11b and 12b (shown in solid line) engaging the edge of disk 1. To this end, positioning members 11 and 12 are swivelled about an axis 14 which is parallel to the normal axis 13 of the disk. During this motion the positioning and/or orienting of the disk is corrected by engaging portions having engaging surfaces 11c, 12c on the edge of the disk 1, which is a process specifically elucidated below in conjunction with FIG. 4.

Figure 4:
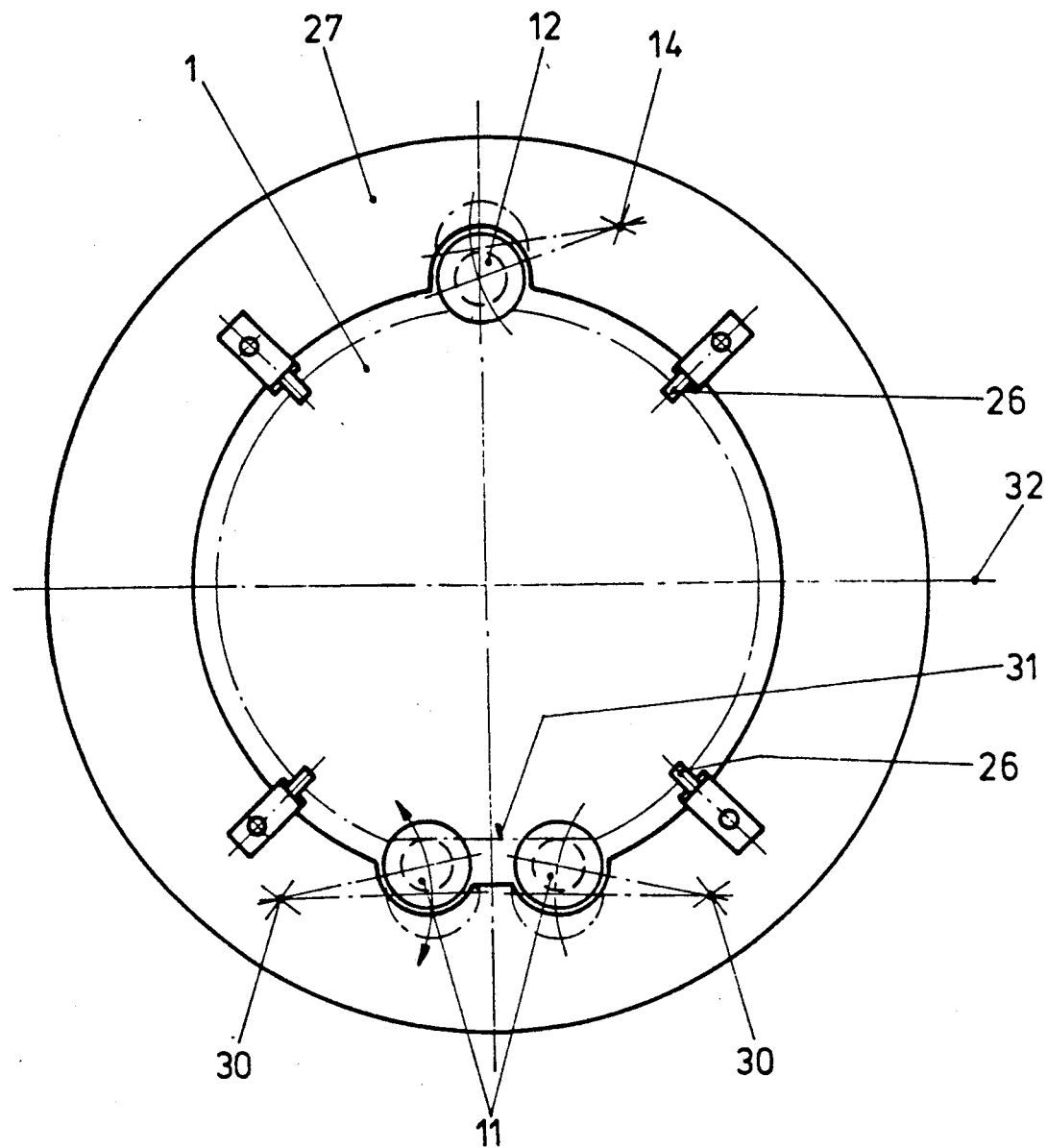
FIG. 4 is a plan view from above showing the disk, the holding frame, and the holding members.

As shown in FIGS. 1 and 4, the positioning or holding members 11 and 12 are mounted to drive mean in the form of driving shafts 15 which are pivoted on bearings 16 about respective first axes 14 and 30 which are eccentric to shafts 15 to swing the holding members in and out with respect to disk 1. The shafts 15 each form second axes and each comprise two parts which are telescopingly placed one into the other which can be slid together against the force fo a coil spring 17.

A valve head 18, which in this example is pot-shaped, functions as a mounting base for the holding members with their motion mechanics and for the base 2. Head 18 forms, together with these parts, a driven lifting arrangement or lifting means 3 for the disk 1. This is movable with respect to an outer wall 19 of a vacuum container. Metallic folding covers which are not visible in FIG. 1 act as seals against the atmosphere 20. A wall 21 separates a transport chamber 22 from the working chamber 23, both of which are formed as vacuum receptacles. The wall 21 is developed around a feed-through opening 25 in the region 24 as a valve seat for the valve head 18. A movable frame 27 provided with hooks 26 rests freely in the opening 25 on the wall 21. A cover or covering 28 is firmly connected to the wall 21. Covering 28 is readily detachable during maintainance work.

Figure 2:
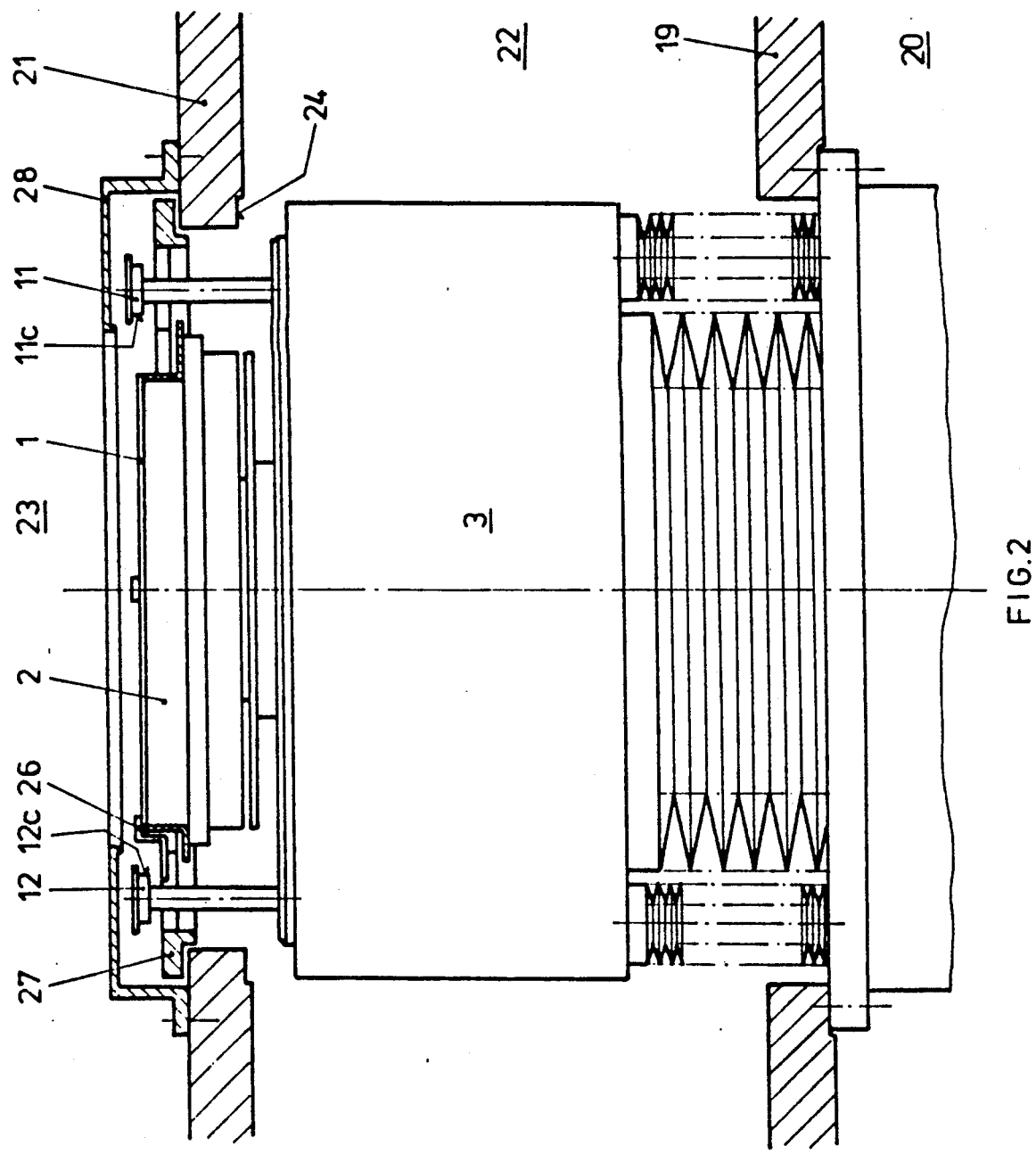
FIG. 2 is a sectional view of a similar holding device according to the invention in an intermediate position.
Figure 3:
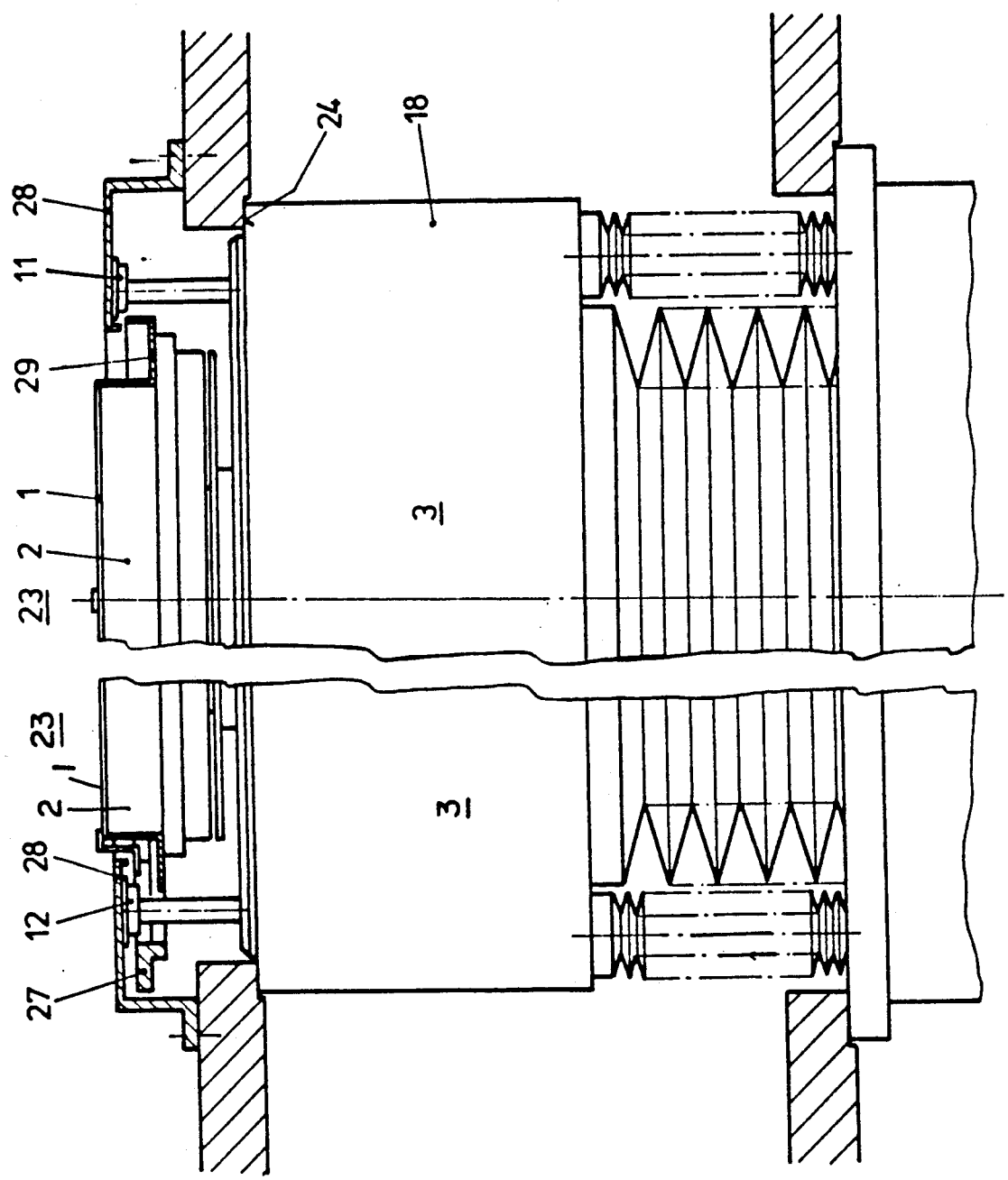
FIG. 3a is a partial sectional view of the same holding device as that of FIG. 2 in the working position, and having a holding frame.
FIG. 3b is a partial view similart to FIG. 3a showing a version of the invention without the holding frame but with expanded frame-shaped shielding.

FIG. 2 shows the holding device after the base 2 with the disk 1 has been brought into an intermediate position and has contacted the movable holding frame 27 on the hooks 26 and has lifted it slightly. The holding frame 27 now hangs on the disk 1, presses it against the base 2 and in this way secures it against lateral sliding. The holding members 11 and 12 after their swivel motion which is carried out in the intermediate position have been moved into their "open" position. The holding members are swivelled by a holding member drive which operates in syncronism with the lifting drive (not shown). FIG. 3 shows the holding device in the working position. This position is defined mechanically by the stop of the value head 18 on the valve seat 24. The disk 1 projects into the working chamber 23 and is fully exposed to the working process while the positioning members 11 and 12 are resiliently pressed against the covering 28 through the action of springs 17.

FIG. 3a shows the movable holding frame 27. In FIG. 3b, by contrast, is a version of the holding device without such holding frame. The disk 1 here lies freely on the base 2, without heating plate, because without the holding frame the heat transfer would not be ensured in any case. For the protection of the parts below the covering 28 a shielding frame 29 is fastened on the support. Frame 29 has, for example, the shape of a trough. During coating processes it must offer space for thick coatings for example of aluminum up to 7 mm thick. Coatings of this thickness can also grow on the covering 28. It is therefore easily exchangeable as is the movable holding frame 27 or the shielding frame 29.

FIG. 4 shows the movable holding frame 27 with hooks 26 and the holding members 11 and 12 in form-fitting contact with disk 1, seen from the working chamber 23 if the covering 28 is removed. The condition is shown which exists after arrival of the base in the intermediate position, however before the outward swivelling of the holding members. It is identical with the situation in the loading position after the swivelling in of the holding members into the "closed" position. The frame 27 lies in a plane above the disk 1 and the holding members 11, 12. The two situations are repeated during the transport back from the working position to the loading position. Two times during each working cycle with to-and-from transport, specifically each time during the swivelling in of the holding members into the "closed" position, the disk orientation (azimuthal position) and/or position are corrected. Therein first the portioning members 11 are swivelled about the axis 30 and pressed hard on a mechanical reference stop (not shown). Then the positioning member 12 is swivelled inwardly about the axis 14. It presses the disk, 1 with the segment (or flat) 31 softly against the positioning members 11 and thereby, corrects the disk orientation and/or position if the positioning members 11 are not simultaneously contacted by segment 31, i.e. if the positioning members 11 and the segment 31 are not parallel from the outset. A displacement of the disk in the direction of the axis 32 through the process of the orientation correction can be limited in both positions: in the loading position through the means not described here for the disk transport from station to station, in the intermediate position through the frame 27 or parts fastened thereon. Each positioning member 11, 12 also has a contact surface above engaging surfaces 11c and 12c which extend over the disk in the engagement position so that when the base 2 is lowered the positioning members help tear the disk off the hooks 26.

Figure 5A:
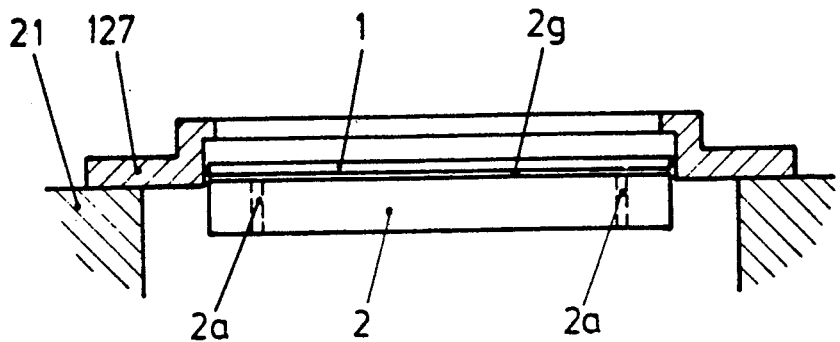
FIG. 5a is a schematic view of a holding frame according to the invention for the holding of the disk in a working position but with the disk not yet assuming the working position.
Figure 5B:
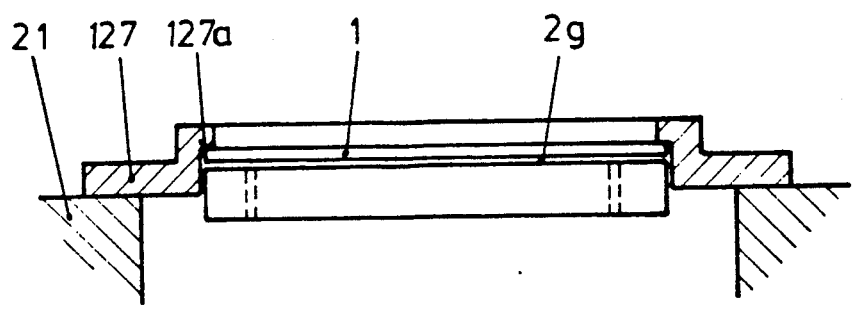
FIG. 5b is a view similar to FIG. 5a but with the disk assuming the working position.
Figure 6:
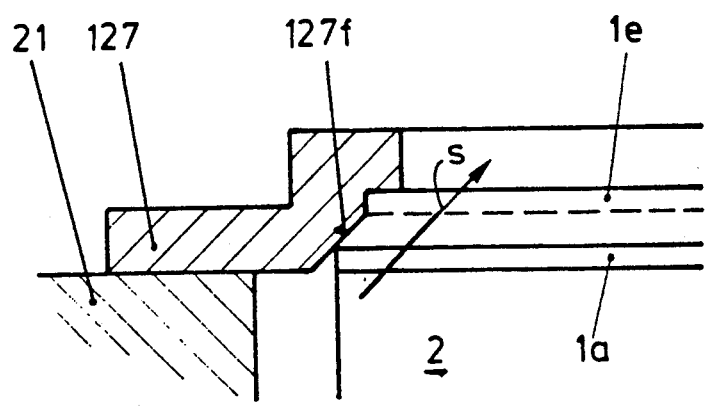
FIG. 6 is a schematic and partial view of a holding ring for a disk in a working position, with, for example, positioning and/or orienting members developed as guiding faces.

In FIGS. 5a, 5b and 6 the disk 1 is shown schematically in a working position with a holding ring 127 as fixation or position member for the disk in this position. According to FIG. 5a the base 2 with the disk 1 is shown immediately before reaching the working position. With the aid of the gas supply 2a shown schematically between the disk 1 and the base 2, as has been stated, a gas cushion 2g improving the thermal conduction and the heat transfer is generated which lifts the disk 1 somewhat to a slight extent which is exaggerated in the figures. With increased lifting of the disk 1 with the aid of the driven base 2 according to FIG. 5b the disk 1 now comes peripherally into contact with the flanges of the holding ring 127 and through the pressure difference of the possibly controlled gas pressure in the gas cushion 2g and the ambient pressure in the working chamber is pressed against the holding flange 127a of the holding ring 127. In this embodiment the holding ring 127 remains braced on part 21 and the disk 1 is solely placed on the flange 127a of this ring through the cited, possibly settable gas pressure difference and the corresponding forces. In FIG. 6 a section of a representation according to FIG. 5a is shown. In order to orient the disk 1 if necessary, i.e. to direct it azimuthally, and/or to position, i.e. in a translational motion bring it into its NOMINAL-position, on the inner slopes of the holding ring 127 guide elements such as guide faces 127f can be provided. With increased contact pressure between the disk 1 in the first assumed position 1a against slope 127f the disk shifts gently against its NOMINAL-position as represented with arrow s and finally assumes the position shown in FIG. 6 in dashed lines and labeled 1e.

Consequently the holding ring, free from positioning or holding members as described in conjunction with FIGS. 1 to 4, functions as holding and positioning member for disk 1 in working position, and can readily be exchanged.

With respect to the holding ring the preferred embodiment consists in gently urging the disk against the ring by means of the gas cushion. Alternately, such urging is achieved by way of resilient members, such as leaf springs (not shown).

While specific embodiments of the invention have been shown and described in detail to illustrate the application of the principles of the invention, it will be understood that the invention may be embodied otherwise without departing from such principles.

What is claimed is:

1. An arrangement for holding a disk in a vacuum treatment chamber, comprising:
   a movable support with a support surface for the disk;
   a rigid holding frame having an opening therein for the disk as the disk moves into the vacuum chamber by the movable support;
   the rigid holding frame comprising engagement means extending inwardly of the opening for engaging the disk as the disk moves through the opening of the frame; and
   rest means for supporting the frame and for allowing lift-off movement of the frame from the rest means, the disk being movable for engaging the engagement means and for lifting off the rigid holding frame the rigid holding frame returning to the rest means as the mobile support moves the disk out of the vacuum chamber.

2. The arrangement of claim 1 including means for lifting the support surface into the opening of the rigid holding frame for engaging the engagement means by the disk.

3. The arrangement of claim 2 wherein said engagement means comprise at least three engagement members distributed around and extending inwardly of said frame opening.

4. The arrangement of claim 1 wherein said frame has a selected weight so that said engagement means bear down on the disk by a selected force when the disk is engaged with said engagement means.

5. The arrangement of claim 1 including at least one gas feed line connected to said support for supplying gas between said support surface and the disk, the gas between said support surface and the disk urging the disk against said engagement means when the disk is engaged with said engagement means.

6. The arrangement of claim 5 including a plurality of bores through said support surface, said bores being connected to said gas feed line for supplying the gas.

7. The arrangement of claim 6 including a gas distribution chamber in said support between said gas feed line and said plurality of bores for distributing gas among said plurality of bores.

8. The arrangement of claim 7 including positioning means operating around said support surface for positioning the disk at a selected position on said support surface.

9. The arrangement of claim 8, wherein:
   said support and support surface are movable to bring the disk into a working position in the treatment chamber for treatment of the disk;
   said positioning means including at least three positioning members located around said support surface and mutually movable toward each other into an engagement position for engaging and positioning the disk on said support surface and away from each other into a respective release position for releasing the disk on said support surface;
   further comprising drive means connected to said positioning members for mutually moving said positioning members between said engagement and release positions; and
   further comprising a cover with at least one surface exposed to the treatment chamber, said cover being positioned for concealing said at least three positioning members from said treatment, when said positioning members are in said release position.

10. The arrangement of claim 9, wherein said positioning members are each pivotally mounted with respect to said support on respective first axes, substantially parallel to a direction of said movement of said support surface, for mutual movement between said engagement and release positions.

11. The arrangement of claim 10, wherein each of said positioning members includes a contact portion for engaging the disk, each contact portion being mounted for rotation about a second axis which is arranged substantially parallel to and offset from respective ones of said first axes.

12. The arrangement of claim 11, wherein each of said positioning members is coupled to a telescopic shaft, said arrangement further comprising spring means engaged to said telescopic shaft for exerting a biasing force to extend said telescopic shaft, said lifting means urging said positioning members against said cover as said support surface moves toward said working position, for compressing each telescopic shaft against the biasing force of said spring means.

13. The arrangement of claim 9, including bearing means for moving each positioning member between said engagement and release positions, each bearing means being positioned outside of said treatment chamber when said disk is in said working position.

14. The arrangement of claim 9, wherein said positioning members each include a first engaging surface for engaging a periphery of the disk on said support surface, said first engaging surfaces of said positioning members extending substantially perpendicularly to said support surface.

15. The arrangement of claim 9, each positioning member comprising an engaging surface extending substantially parallel to said support surface and engagable over a substantially planar surface of the disk when said positioning members are in said engagement position, for tearing the disk off said holding frame when said support surface moves said disk from said working position.

16. The arrangement of claim 9, wherein said positioning members are mounted for lateral movement with respect to said support surface.

17. The arrangement of claim 9, including lifting means for moving said support to move said disk into and from said working position, said drive means mutually moving said positioning members synchronized with said moving of said support by said drive means.

18. The arrangement of claim 17, wherein said drive means moves said positioning members toward said respective release positions before said lifting means moves said disk into said working position.

19. The arrangement of claim 17, wherein said treatment chamber includes an opening through which said lifting means moves said support for bringing said disk into said working position in said treatment chamber, the arrangement including value means for clasing said opening in a vacuum-tight manner as said support is moved toward said working position, said value means being moved by said lifting means.

20. The arrangement of claim 17, wherein said drive means moves said positioning members toward said engagement working position so that the disk is positioned on said support surface during movement of said support toward said working position.

21. The arrangement of claim 17, wherein said treatment chamber includes an opening through which said support passes when said lifting means moves said support toward said working position, said cover being positioned around said opening and including a second opening coaxial to said opening of said treatment chamber, said support being smaller than said second opening in said cover so that with said disk in said working position, said support is spaced from said cover, the lateral extent of said opening in said cover being smaller than the combined lateral extent of said support and said positioning members.

22. The arrangement of claim 6, wherein said bores have a cross-sectional diameter substantially smaller than their axial extent.

23. The arrangement of claim 6, wherein said bores are evenly distributed along said support surface.

24. The arrangement of claim 5, including heating means in said support for heating the disk.

25. The arrangement of claim 5, including cooling means in said support for cooling the disk.

26. The arrangement of claim 1, wherein said treatment chamber includes an opening, and further comprising lifting means for moving said support, said support passing through said opening as said lifting means moves said support toward a working position for treatment of the disk, said rest means being formed by wall means of said treatment chamber adjacent said opening, said holding frame being movable with the disk and from said wall means when the disk engages said engagement means as said support moves to said working position.

27. The arrangement of claim 26, a gap being formed between said support and said wall means, said holding frame being structured to shield said gap.

28. The arrangement of claim 1, wherein said engagement means comprise hooks projecting inwardly with respect to said opening and being distributed around said opening.

29. The arrangement of claim 1, further comprising movable members linked to said support and movable parallel to said support surface mutually toward and from each other, said members engaging the disk engaged to said engagement means of said frame, so as to tear the disk off said frame as said support is retracted from said frame.

30. The arrangement of claim 1, further comprising positioning surfaces for positioning the disk on said support surface as it engages said positioning surfaces, said positioning surfaces being provided adjacent said opening of said frame.

31. The arrangement of claim 1, wherein said holding frame is structured for engaging the disk to preclude lateral movement of the disk laterally of said support surface.

* * * * *